US012063846B2

(12) United States Patent
Son et al.

(10) Patent No.: US 12,063,846 B2
(45) Date of Patent: Aug. 13, 2024

(54) DISPLAY DEVICE CAPABLE OF PREVENTING BURNT

(71) Applicant: LG DISPLAY CO., LTD., Seoul (KR)

(72) Inventors: Hoonsok Son, Paju-si (KR); Dojoong Kim, Paju-si (KR)

(73) Assignee: LG Display Co., Ltd., Seoul (KR)

(*) Notice: Subject to any disclaimer, the term of this patent is extended or adjusted under 35 U.S.C. 154(b) by 136 days.

(21) Appl. No.: 17/539,998

(22) Filed: Dec. 1, 2021

(65) Prior Publication Data
US 2022/0209209 A1 Jun. 30, 2022

(30) Foreign Application Priority Data
Dec. 30, 2020 (KR) .................. 10-2020-0188228

(51) Int. Cl.
H01L 29/08 (2006.01)
H10K 50/824 (2023.01)
H10K 59/122 (2023.01)
H10K 71/00 (2023.01)

(52) U.S. Cl.
CPC ........... H10K 71/00 (2023.02); H10K 50/824 (2023.02); H10K 59/122 (2023.02)

(58) Field of Classification Search
CPC ..... H10K 71/00; H10K 59/122; H10K 50/824
USPC ........................................................ 257/40
See application file for complete search history.

(56) References Cited

U.S. PATENT DOCUMENTS

2014/0312323 A1* 10/2014 Park .................. H10K 59/1315 438/23
2016/0351638 A1* 12/2016 Im .......................... H10K 50/84
2018/0151828 A1* 5/2018 Im ......................... G09G 3/3208

FOREIGN PATENT DOCUMENTS

| KR | 20160012876 A | * | 2/2016 | ............. H10K 59/12 |
| KR | 10-2017-0050733 A | | 5/2017 | |
| KR | 20180013225 A | * | 2/2018 | ........... H01L 59/122 |
| KR | 10-2018-0062293 A | | 6/2018 | |
| KR | 10-1878186 B1 | | 8/2018 | |
| KR | 20200044520 A | * | 4/2020 | ........... H10K 59/131 |

OTHER PUBLICATIONS

Office Action issued Mar. 29, 2024 for Korean Patent Application No. 10-2020-0188228 (See English Translation) (Note: KR 10-2018-0013225 A was cited in a prior PTO-892.).

* cited by examiner

Primary Examiner — Phuc T Dang
(74) Attorney, Agent, or Firm — Morgan, Lewis & Bockius LLP

(57) ABSTRACT

The present disclosure relates to an organic light emitting display device and a method for manufacturing the same. In the organic light emitting display device according to the present disclosure, a bank which exposes an auxiliary electrode connected to a cathode electrode of an organic light emitting device is composed of multiple layers, and particularly, since the lowest layer of the bank, which is adjacent to the auxiliary electrode, includes an undercut, the cathode electrode and the auxiliary electrode are directly connected so that it is possible to prevent burnt due to a short-circuit between the cathode electrode and Ag included in the auxiliary electrode.

13 Claims, 13 Drawing Sheets (a)

(b)

DISPLAY DEVICE CAPABLE OF PREVENTING BURNT

This application claims the benefit of Korean Patent Application No. 10-2020-0188228 filed on Dec. 30, 2020, the entire contents of which is incorporated herein by reference for all purposes as if fully set forth herein.

BACKGROUND

Technical Field

The present disclosure relates to an organic light emitting display device and a method for manufacturing the same. In the organic light emitting display device according to the present disclosure, a bank which exposes an auxiliary electrode connected to a cathode electrode of an organic light emitting device is composed of multiple layers, and particularly, since the lowest layer of the bank, which is adjacent to the auxiliary electrode, includes an undercut, the cathode electrode and the auxiliary electrode are directly connected so that it is possible to prevent burnt due to a short-circuit between the cathode electrode and Ag included in the auxiliary electrode.

Discussion of the Related Art

An active-matrix type organic light emitting display device includes an organic light emitting diode (OLED) and has a rapid response speed, a high light emission efficiency, a high luminance, and a large view angle.

Recently, a technology for forming a light emitting layer of the organic light emitting device through a solution process using an inkjet equipment, etc., is being developed. The solution process is performed by applying a solution for forming the light emitting layer on a set region and by drying it.

SUMMARY

The organic light emitting display device may be divided into a top emission type organic light emitting display device, a bottom emission type organic light emitting display device, and a dual emission type organic light emitting display device in accordance with a direction in which light is emitted. The top emission type organic light emitting display device emits light in a direction opposite to a substrate on which pixels are arranged, and has an advantage in that an opening ratio can be increased compared to the bottom emission type in which light is emitted in a direction of the substrate on which the pixels are arranged.

In the top emission type organic light emitting display device, an anode is formed under an organic layer, and a cathode is formed over the organic layer through which light is transmitted. Here, the cathode should be formed thin in order to be implemented as a semi-transmissive layer having a low work function. In this case, the cathode has a high resistance.

In the top emission type organic light emitting display device, a voltage drop (IR drop) occurs due to the high resistivity of the cathode, and thus voltages of different levels are applied to each pixel, resulting in non-uniformity of luminance or image quality. In particular, as the size of a display panel increases, the voltage drop may be intensified.

Accordingly, embodiments of the present disclosure are directed to a display device that substantially obviates one or more of the problems due to limitations and disadvantages of the related art.

The present disclosure has been made to solve the above problems. The aspect of the present disclosure is to provide an organic light emitting display device capable of preventing a voltage drop of a cathode and a method of manufacturing the same. Another aspect of the present disclosure is to provide an organic light emitting display device capable of connecting an auxiliary electrode and a cathode electrode while depositing an electron transport layer (ETL) over the entire surface, and a method for manufacturing the same. Further another aspect of the present disclosure is to provide an organic light emitting display device capable of facilitating contact between an auxiliary electrode and a cathode electrode, and a method of manufacturing the same. Also, yet another aspect of the present disclosure is to provide an organic light emitting display device capable of preventing burnt due to a short circuit between a cathode electrode and Ag included in an auxiliary electrode because the cathode electrode and the auxiliary electrode can be directly connected and a method for manufacturing the same.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a display device comprises: a light emitting device which includes a first electrode, a light emitting layer disposed on the first electrode, an electron transport layer disposed on the light emitting layer, and a second electrode disposed on the electron transport layer; a driving transistor which is electrically connected to the first electrode and supplies a driving current to the light emitting device; an auxiliary electrode which is disposed apart from the driving transistor and is electrically connected to the second electrode; and a bank which is composed of multiple layers on the auxiliary electrode and of which a lowest layer adjacent to the auxiliary electrode among the multiple layers includes an undercut. The auxiliary electrode includes a first auxiliary electrode, a second auxiliary electrode disposed on the first auxiliary electrode, and a third auxiliary electrode disposed on the second auxiliary electrode.

The first auxiliary electrode and the third auxiliary electrode are formed of ITO or IZO, and the second auxiliary electrode is formed of Ag or an alloy including Ag.

The display device includes an auxiliary electrode hole which exposes a top surface of the first auxiliary electrode, and the second electrode is electrically connected to the top surface of the first auxiliary electrode in the auxiliary electrode hole.

The display device includes a second bank hole which exposes at least one side of the bank in a reverse tapered shape and exposes the top surface of the first auxiliary electrode.

The bank includes: a first bank including an undercut; and a second bank stacked on the first bank.

The first bank is formed of an inorganic insulating material, and the second bank is formed of an organic insulating material.

One side of the second bank, which is exposed by the second bank hole protrudes more than one side of the first bank, which is exposed by the second bank hole.

The electron transport layer is disposed on the first auxiliary electrode within the second bank hole, and the display device includes a contact hole which exposes a part of the top surface of the first auxiliary electrode.

The second electrode is electrically connected to the top surface of the first auxiliary electrode in the contact hole.

The electron transport layer is located on the bank and is separated by the undercut structure.

The second electrode is located on the bank and is separated by the undercut structure.

The thickness of the bank is larger than that of the light emitting layer.

The first electrode and the auxiliary electrode are formed of the same material and have the same structure.

The thickness of the first auxiliary electrode is larger than that of the third auxiliary electrode.

In another aspect, a display device manufacturing method comprises: forming an auxiliary electrode composed of a first auxiliary electrode on a substrate, a second auxiliary electrode disposed on the first auxiliary electrode, and a third auxiliary electrode disposed on the second auxiliary electrode; forming an auxiliary electrode hole which exposes the first auxiliary electrode; forming a bank which is composed of multiple layers on the auxiliary electrode and of which a lowest layer adjacent to the auxiliary electrode among the multiple layers includes an undercut; forming an electron transport layer of a light emitting device; and forming a second electrode of the light emitting device.

The forming the bank includes: stacking a first bank and a second bank sequentially; and forming a second bank hole which passes through the first and second banks and exposes the first auxiliary electrode.

In the forming the second bank hole, one side of the second bank, which is exposed by the second bank hole protrudes more than one side of the first bank, which is exposed by the second bank hole.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Hereinafter, exemplary embodiments of the present invention will be described with reference to the accompanying drawings. Throughout the disclosure, the same references mean substantially the same components. In the following description, the detailed description of known functions and configurations incorporated related to the present invention is omitted when it may make the subject matter of the present invention rather unclear. Also, the component names used in the following description may be selected in consideration of making it easier to write the specification and may be different from the component names of an actual product.

In describing the components of the present invention, terms such as the first, the second, A, B, (a), (b), etc., can be used. Such terms are used only to distinguish one component from other components, and the essence, order, or number, etc., of the component are not limited by the terms. When it is said that a component is "connected", "coupled" or "accessed" to another component, it should be understood that not only the component may be directly connected or accessed to that other component, but also another component may be "interposed" between respective components or each component may be "connected", "coupled", or "accessed" by other components.

Figure 1:
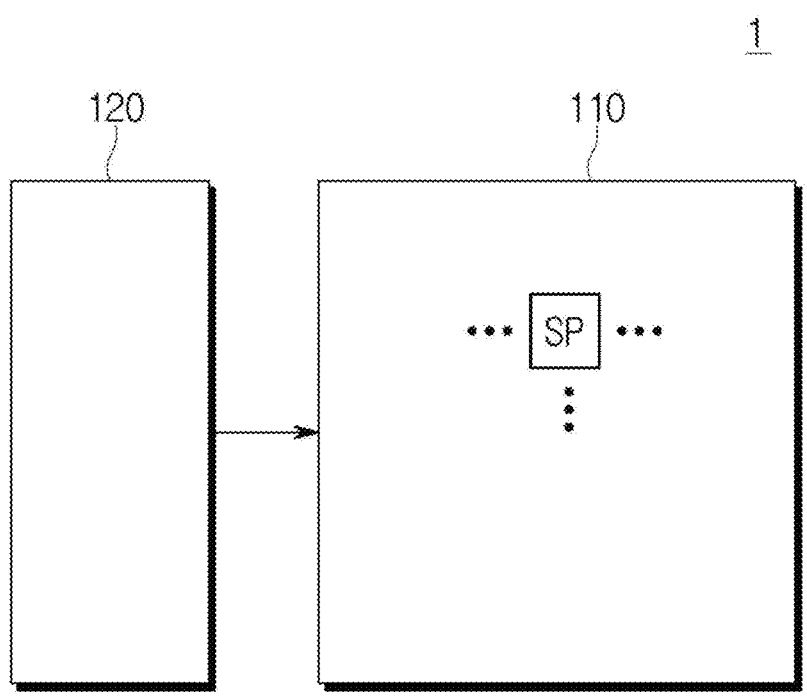
FIG. 1 is a plan view showing schematically a display device according to an embodiment of the present invention.

FIG. 1 is a plan view schematically showing a display device 1 according to an embodiment of the present invention.

Referring to FIG. 1, the display device 1 according to the present embodiment may include a display panel 110 and a driver 120. The display panel 110 may include a plurality of subpixels SP arranged in the form of a matrix on a substrate. The driver 120 may include a scan driver which applies a scan signal to a scan line connected to the subpixel SP and a data driver which applies a data signal to a data line. The driver 120 may be disposed in a non-display portion of the substrate, which is around the display panel 110 in which the subpixels SP are arranged. The driver 120 is formed in the form of an integrated circuit chip and may be directly mounted on the substrate on which the display panel 110 has been formed, may be mounted on a flexible printed circuit film, may be attached on the substrate in the form of a tape carrier package (TCP), or may be formed directly on the substrate.

Figure 2:
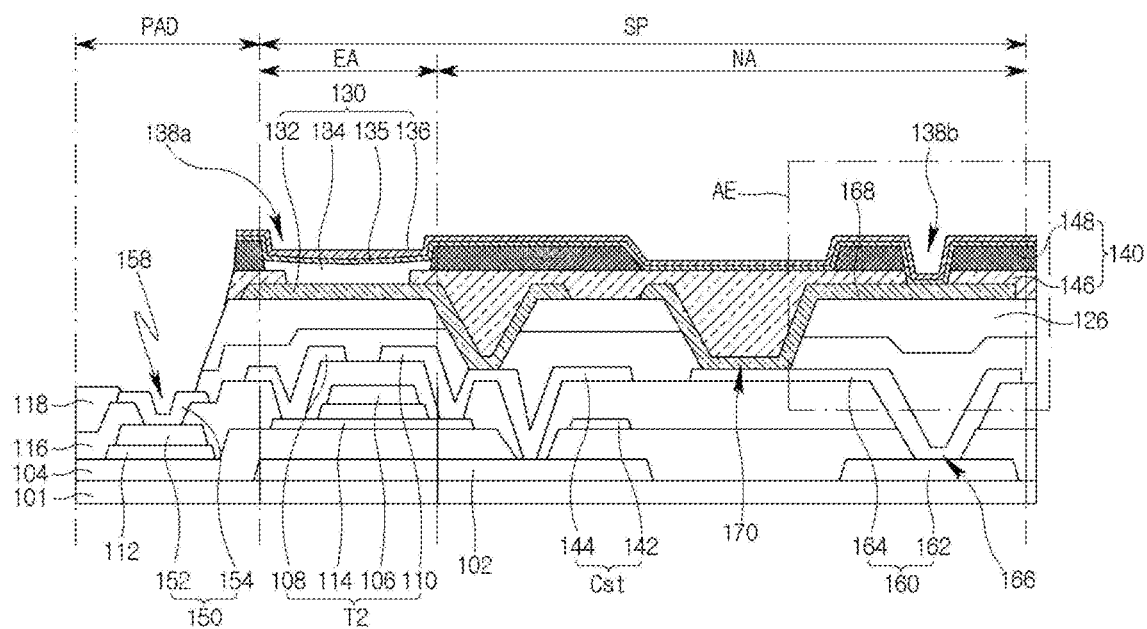
FIG. 2 is a cross sectional view of a display panel according to the embodiment.

FIG. 2 is a cross sectional view of the display panel according to the embodiment.

The display panel includes an active area and a pad area.

In the pad area PAD, the scan line and a plurality of pads 150 for supplying driving signals to each data line are formed.

Each of the plurality of pads 150 includes a pad lower electrode 152 and a pad upper electrode 154.

The pad lower electrode 152 is formed of the same material as that of a gate electrode 106 on a gate insulating pattern 112 which has the same shape as that of the pad lower electrode 152.

The pad upper electrode 154 is formed of the same material as those of a source electrode 108 and a drain electrode 110 on an interlayer insulating layer 116 that is the same layer as the source and drain electrodes 108 and 110.

The pad upper electrode 154 is electrically connected to the pad lower electrode 152 exposed through a first pad contact hole 158 which passes through the interlayer insulating layer 116. Also, the pad upper electrode 154 is exposed to the outside to contact with a circuit transfer film connected to a driving circuit. Here, in order to prevent the pad upper electrode 154 exposed to the outside from being corroded by external moisture, etc., the pad upper electrode 154 is made of a metal with a high corrosion resistance and a high acid resistance, such as Mo, Ti or is formed as a single layer or multiple layers where Ti is located on the uppermost layer. For example, the pad upper electrode 154 may have a multilayer structure formed by stacking in the order of MoTi/Cu/MoTi.

In the active area, the plurality of subpixels SP are arranged in the form of a matrix to display an image. Each subpixel SP disposed in the active area includes a pixel driving circuit disposed in a circuit area CA and a light emitting device 130 connected to the pixel driving circuit. The active area includes a light emitting area EA and a non-light emitting area NA.

The pixel driving circuit includes a switching transistor (not shown), a driving transistor T2, and a storage capacitor Cst.

The switching transistor is turned on when a scan pulse is supplied to the scan line. Then, switching transistor supplies the data signal supplied to the data line to the storage capacitor Cst and a gate electrode of the driving transistor T2.

The driving transistor T2 controls the amount of light emission of the light emitting device 130 by controlling a driving current supplied to the light emitting device 130 in response to the data signal supplied to the gate electrode of the driving transistor T2. Also, even though the switching transistor is turned off, the driving transistor T2 supplies a constant driving current by a voltage charged in the storage capacitor Cst until the data signal of the next frame is supplied, so that the light emission of the light emitting device 130 is maintained.

To this end, the driving transistor T2 includes the gate electrode 106, the source electrode 108, the drain electrode 110, and an active layer 114.

The gate electrode 106 is formed on the gate insulating pattern 112 of the same pattern as that of the gate electrode 106. The gate electrode 106 overlaps with a channel region of the active layer 114 with the gate insulating pattern 112 placed therebetween. The gate electrode 106 may be formed as a single layer or multiple layers made of any one of molybdenum (Mo), aluminum (Al), chromium (Cr), gold (Au), titanium (Ti), nickel (Ni), neodymium (Nd), and copper (Cu) or an alloy thereof, but is not limited thereto. For example, the gate electrode 106 may have a multilayer structure formed by stacking in the order of Cu/MoTi.

The source electrode 108 is connected to a source region of the active layer through a source contact hole (not shown) which passes through the interlayer insulating layer 116.

The drain electrode 110 is connected to a drain region of the active layer through a drain contact hole (not shown) which passes through the interlayer insulating layer 116. Also, the drain electrode 110 is exposed through a pixel contact hole formed to pass through a protective layer 118 and a planarization layer 126 and is connected to an anode electrode 132.

The source electrode 108 and the drain electrode 110 may be, for example, formed as a single layer or multiple layers made of any one of molybdenum (Mo), aluminum (Al), chromium (Cr), gold (Au), titanium (Ti), nickel (Ni), neodymium (Nd), and copper (Cu) or an alloy thereof, but is not limited thereto.

The active layer 114 includes the source region and the drain region which face each other with a channel region (not shown) placed therebetween. The channel region overlaps with the gate electrode 106 with the gate insulating pattern 112 placed therebetween. The source region is connected to the source electrode 108 through the source contact hole, and the drain region 114D is connected to the drain electrode 110 through the drain contact hole. A buffer layer 104 and a light blocking layer 102 are formed between the active layer 114 and a substrate 101.

The light blocking layer 102 is formed on the substrate 101 in such a manner as to overlap the channel region of the active layer 114. Since the light blocking layer 102 absorbs or reflects light incident from the outside, light incident on the channel region can be minimized. Here, the light blocking layer 102 may be exposed through a buffer contact hole (not shown) which passes through the buffer layer 104 and the interlayer insulating layer 116, and may be electrically connected to the drain electrode 110. The light blocking layer 102 is formed of an opaque metal such as Mo, Ti, Al, Cu, Cr, Co, W, Ta, and Ni.

The buffer layer 104 is formed of silicon oxide or silicon nitride in a single-layer or multi-layer structure on the substrate 101 made of a plastic resin such as glass or polyimide (PI). The buffer layer 104 serves to aid the crystallization of the active layer 114 by preventing the diffusion of moisture or impurities generated in the substrate 101 or by controlling a heat transfer speed during crystallization.

The storage capacitor Cst is formed by overlapping a storage lower electrode 142 and a storage upper electrode 144 with the interlayer insulating layer 116 placed therebetween. Here, the storage lower electrode 142 is formed of the same material on the same layer as the active layer 114, and may be made to be conductive by controlling an oxygen content. The upper storage electrode 144 is formed of the same material on the same layer as the source electrode 108.

The active layer 114 is made of an oxide semiconductor material and has conduction properties that vary according to the oxygen content. A metal oxide semiconductor material such as indium-gallium-zinc oxide which is used for the active layer 114 has semiconductor characteristics by appropriately adjusting the oxygen content. Here, if the oxygen content is reduced, metallic properties are reinforced and then the active layer becomes to have conductor properties. Various methods can be considered for optionally reducing the content of oxygen included in a process of forming the active layer 114. However, in order to reduce the oxygen content only in a selective region, a plasma treatment process is used. That is, the active layer 114 may be treated by plasma to remove oxygen included therein so that the active layer can be made to be conductive. In the plasma process, helium (He), hydrogen ($H_2$), or argon (Ar) can be used.

Even though the switching transistor T1 is turned off by the voltage charged in the storage capacitor Cst, the driving transistor T2 supplies a constant current until the data signal of the next frame is supplied, so that the light emission of the light emitting device 130 is maintained.

The light emitting device 130 includes the first electrode 132, a light emitting layer 134 disposed on the first electrode, an electron transport layer 135 disposed on the light emitting layer 134, and a second electrode 136 disposed on the electron transport layer 135. The first electrode 132 may function as an anode electrode for supplying holes to the light emitting layer 134, and the second electrode 136 may function as a cathode electrode for supplying electrons to the light emitting layer 134. However, this is illustrative and the technical spirit of the present disclosure does not exclude that the first electrode functions as the cathode electrode and the second electrode functions as anode electrode. Hereinafter, the light emitting device will be described under the assumption that the first electrode 132 is the anode electrode and the second electrode 136 is the cathode electrode.

The anode electrode 132 is connected to the drain electrode 110 of the driving transistor T2 through the pixel contact hole (not shown) which passes through the protective layer 118 and the planarization layer 126.

The anode electrode 132 is disposed on the planarization layer 126 in such a way as to be exposed by a first bank hole 138*a* formed to pass through a bank 140. When the anode electrode 132 is applied to a top emission type organic light emitting display device, the anode electrode 132 has a multilayer structure which includes a transparent conductive layer and an opaque conductive layer having a high reflection efficiency. The transparent conductive layer is made of a material having a relatively large work function value, such as indium-tin-oxide (ITO) or indium-zinc-oxide (IZO). The opaque conductive layer has a single-layer or multi-layer structure which includes Al, Ag, Cu, Pb, Mo, and Ti, or an alloy thereof. For example, the anode electrode 132 is formed in a structure in which a transparent conductive layer, an opaque conductive layer, and a transparent conductive layer are sequentially stacked. The anode electrode 132 including the opaque conductive layer overlaps the pixel driving circuit, so that even the circuit area can be used as the light emitting area EA, thereby improving an opening ratio. Also, the anode electrode 132 including an opaque conductive layer enables a resonance structure to be implemented in the top emission type organic light emitting display device. This increases the light emission efficiency of the display device. That is, the light generated from the light emitting layer 134 is reflected from the opaque conductive layer, and the reflected light causes constructive interference with light partially reflected from the transparent conductive layer, so that the intensity of the light is amplified.

The light emitting layer 134 is formed by stacking a hole auxiliary layer, the light emitting layer, and the electron auxiliary layer on the anode electrode 132 in the order listed or in the reverse order thereof. The light emitting layer 134 is disposed in the light emitting area EA provided by the first bank hole 138*a* formed to pass through the bank 140. The light emitting layers 134 disposed in adjacent subpixels SP which create different colors are separated through the bank 140. The light emitting layer 134 may be formed by a solution process. Through the solution process using inkjet equipment or the like, a functional material ink is dripped onto a predetermined pixel area by a plurality of nozzles and dried, so that a required thin film is obtained. When the light emitting layer 134 is formed by the solution process, a difference in surface height may occur between a central area of the light emitting layer 134 and an edge area adjacent to the bank 140 due to a tension between the solution and the bank 140 (pile-up). For example, the light emitting layer 134 may be formed in a concave shape such that the central area of the light emitting layer 134 has the least thickness and a portion of the light emitting layer 134 which is in contact with the bank 140 has the largest thickest.

The cathode electrode 136 is formed on the top surfaces and side surfaces of the light emitting layer 134 and the bank 140 in such a way as to face the anode electrode 132 with the light emitting layer 134 placed therebetween within the first bank hole 138*a*. When the cathode electrode 136 is applied to the top emission type organic light emitting display device, the cathode electrode 136 is made of a transparent conductive layer such as indium-tin-oxide (ITO) or indium-zinc-oxide (IZO).

The cathode electrode 136 is connected to a low potential power line 160 through an auxiliary electrode 168 exposed through a second bank hole 138*b*. The auxiliary electrode 168 is electrically connected to the low potential power line 160 through an auxiliary contact hole 170.

The low potential power line 160 includes first and second low potential power lines 162 and 164 which are connected to each other through a power contact hole 166.

The first low potential power line 162 is formed of the same material as the light blocking layer 102 on the substrate 101 that is on the same plane with the light blocking layer 102. The second low potential power line 164 is formed of the same material as the storage upper electrode 144 on the interlayer insulating layer 116 that is on the same plane with the storage upper electrode 144. The second low potential power line 164 is connected to the first low potential power line 162 exposed through the power contact hole 166 which passes through the buffer layer 104 and the interlayer insulating layer 116.

The second low potential power line 164 is exposed through the auxiliary contact hole 170 formed to pass through the protective layer 118 and the planarization layer 126 and is connected to the auxiliary electrode 168. Meanwhile, it has been described as an example in the present disclosure that the low potential power line 160 has a multilayer structure. Besides, the low potential power line 160 may be formed of the same material as at least any one of the light blocking layer 102, the gate electrode 106, and the source electrode 108 in a single-layer structure.

The bank 140 is formed on the planarization layer 126 in a multi-layer structure.

A first bank 146 is formed of an inorganic insulating material such as SiNx or SiOx on the planarization layer 126 on which the anode electrode 132 and the auxiliary electrode 168 are formed. The first bank 146 not only provides the light emitting area EA, but also prevents external moisture or oxygen from introducing into the light emitting layer 134 which is vulnerable to external moisture or oxygen.

Here, when the first bank 146 is made of SiNx material, the first bank 146 is deposited on the planarization layer 126 by using silane gas $SiH_4$ and gas not including hydrogen as reactive gases. When the reaction gas other than the silane gas contains hydrogen, due to the combination of hydrogen and silane $SiH_4$ included in the reaction gas during the deposition process, the bank made of SiNx material is formed and a large amount of hydrogen remains. When a large amount of hydrogen diffuses into the active layer 114, the hydrogen reacts with the active layer 114 and characteristics (e.g., a threshold voltage, etc.) of a thin film transistor are changed. Accordingly, it is preferable to form the first bank 146 made of SiNx material by using silane gas $SiH_4$ and nitrogen gas $N_2$ as reactive gases in order to prevent changes in characteristics of the thin film transistor.

A second bank 148 is formed of a photosensitive organic insulating material on the first bank 146. The second bank 148 provides the light emitting area EA together with the first bank 146. The second bank 148 is made of the organic insulating material and has a hydrophobic property. Therefore, when the light emitting layer 134 is subsequently formed through the solution process, the light emitting layer 134 is able to perform a function of a dam which prevents ink from mixing between the light emitting areas EA.

Both sides of the first and second banks 146 and 148 are exposed by the first bank hole 138*a* which exposes the top surface of the anode electrode 132 and the second bank hole 138*b* which exposes the top surface of the auxiliary electrode 168, respectively.

Figure 3:
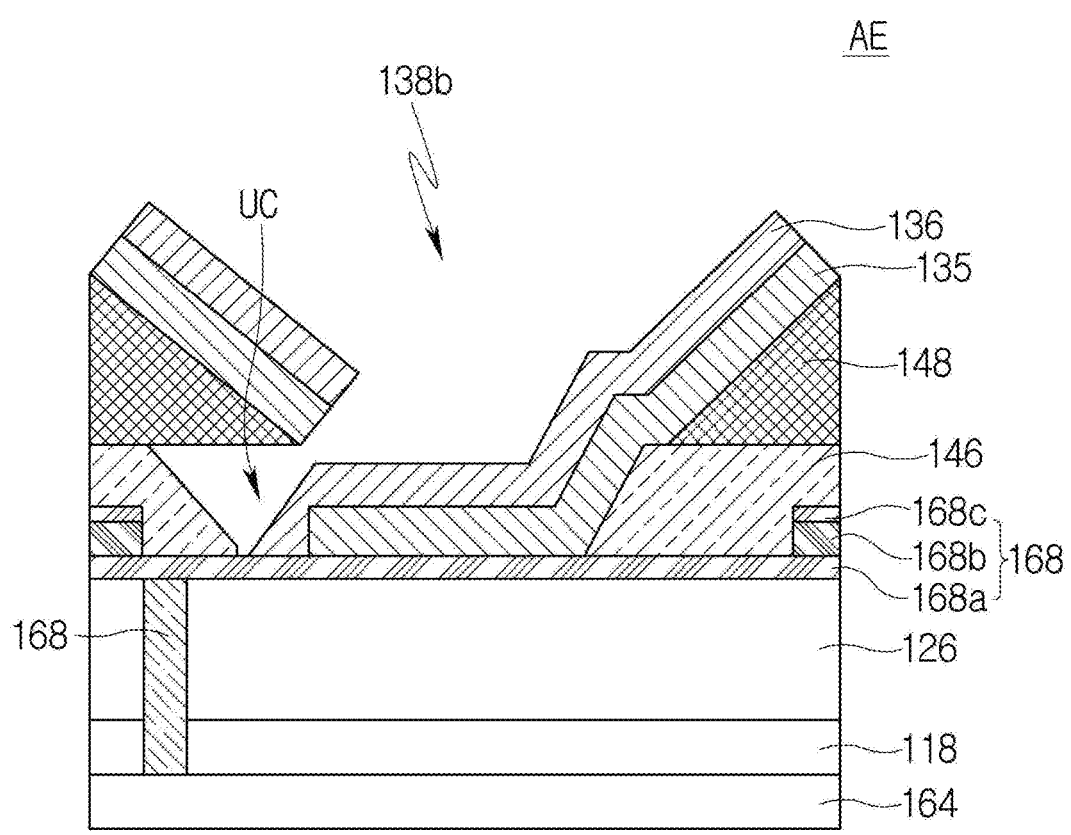
FIG. 3 is a view which shows an embodiment 1 and corresponds to an AE region of FIG. 2.

FIG. 3 is a view which shows an embodiment 1 and corresponds to an AE region of FIG. 2. In the AE region, the cathode electrode 136 and the auxiliary electrode 168 are connected in the second bank hole 138b.

The second bank is composed of multiple layers on the auxiliary electrode 168. In particular, in the embodiment 1, the bank composed of multiple layers is characterized in that the lowest layer of the bank, which is adjacent to the auxiliary electrode 168, includes an undercut UC.

Describing the embodiment 1 with reference to FIGS. 2 and 3, the auxiliary electrode 168 includes a first auxiliary electrode 168a, a second auxiliary electrode 168b disposed on the first auxiliary electrode 168a, and a third auxiliary electrode 168c disposed on the second auxiliary electrode 168b.

The anode electrode 132 and the auxiliary electrode 168 are formed on the same layer, and may be formed of the same material and have the same structure. Specifically, the first auxiliary electrode 168a and the third auxiliary electrode 168c may be formed of ITO or IZO, and the second auxiliary electrode 168b may be formed of Ag or an alloy including Ag.

The auxiliary electrode 168 includes an auxiliary electrode hole (not shown) which partially exposes the top surface of the first auxiliary electrode 168a, and the cathode electrode 136, i.e., the second electrode, is electrically connected to the top surface of the first auxiliary electrode 168a in the auxiliary electrode hole. It is preferable that the first auxiliary electrode 168a should be formed thicker than the third auxiliary electrode 168c because, considering that the auxiliary electrode hole which exposes the top surface of the first auxiliary electrode 168a is formed by etching the second auxiliary electrode 168b, it helps to leave the top surface of the first auxiliary electrode 168a if the first auxiliary electrode 168a is formed thicker than the third auxiliary electrode 168c.

The bank 140 may include the first bank 146 including the undercut UC and the second bank 148 stacked on the first bank 146. One side of the second bank 148 is characterized in that the side of the second bank 148 protrudes more than one side of the first bank 146, which is exposed by the second bank hole 138b. The first bank 146 may be made of an inorganic insulating material, and the second bank 148 may be made of an organic insulating material. It is preferable that the bank 140 should be thicker than the light emitting layer 134 because, in the display device according to the embodiment, the light emitting layer 134 can be formed through the solution process using an inkjet equipment, etc.

One side of the second bank 148, which is exposed by the second bank hole 138b protrudes more than one side of the first bank 146, which is exposed by the second bank hole 138b, so that the first bank 146 includes the undercut UC in a region corresponding to the second bank hole 138b. The side surface of the bank 140, which is exposed by the second bank hole 138b, has a reverse tapered shape. Accordingly, the electron transport layer 135 formed with vertical straightness is not formed in the undercut UC region. Accordingly, the electron transport layers 135 of the adjacent subpixels SP are separated within the second bank hole 138b by the undercut UC of the first bank 146. As a result, the electron transport layer 135 is disposed on the first auxiliary electrode 168a within the second bank hole 138b and the top surface of the first auxiliary electrode 168a is partially exposed. On the other hand, the cathode electrode 136 formed with diffraction properties in vertical, horizontal, and oblique directions has a better step coverage than that of the organic light emitting layer 134 and thus is also formed in the undercut UC region. Accordingly, the cathode electrode 136 is connected to the auxiliary electrode 168 exposed by the second bank hole 138b in the undercut UC region. Specifically, the cathode electrode 136 is directly connected to the first auxiliary electrode 168a. Meanwhile, the cathode electrode 136, that is the second electrode, is located on the bank, and may be separated by an undercut UC structure of the bank.

As described above, the display device according to the embodiment 1 has a structure in which the first auxiliary electrode 168a and the cathode electrode 136 can be directly connected while the electron transport layer ETL is deposited over the entire surface. As a result, the display device according to the embodiment 1 is capable of preventing burnt due to a short-circuit between the cathode electrode 136 and Ag included in the auxiliary electrode 168.

Figure 4:
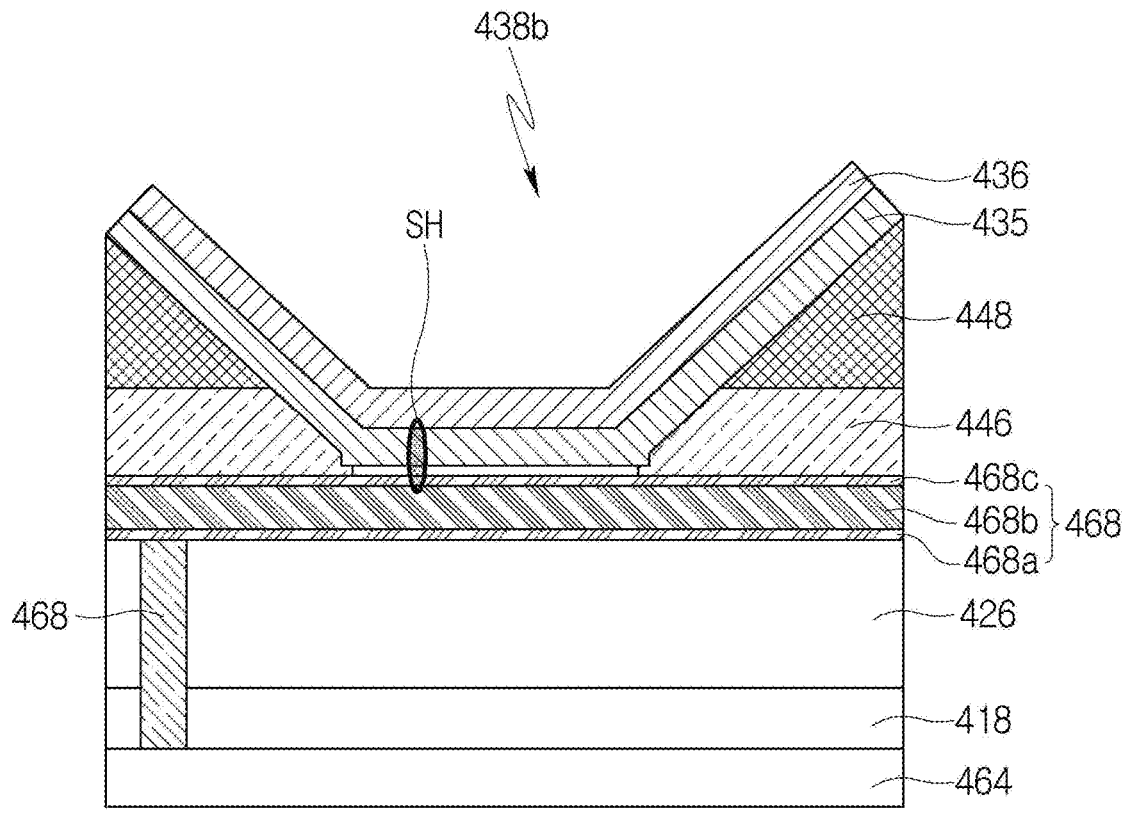
FIG. 4 is a view for describing a burnt phenomenon due to a short-circuit of a cathode electrode and Ag included in an auxiliary electrode according to a comparison example.
Figure 5:
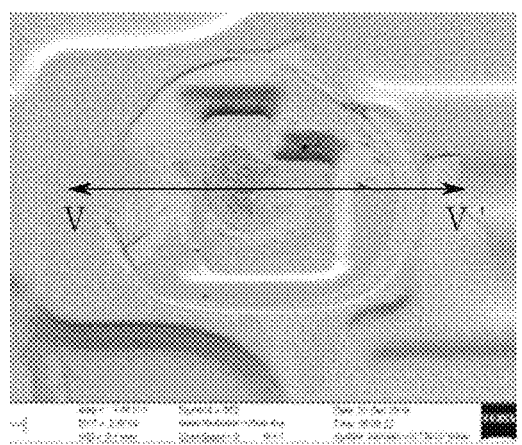
FIG. 5 shows an SEM image showing an example in which the burnt occurs due to the short-circuit of the cathode electrode and Ag included in the auxiliary electrode.
Figure 5:
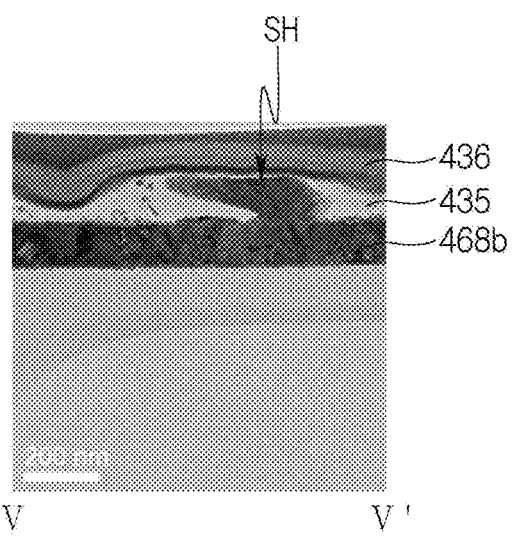

FIG. 4 is a view for describing a burnt phenomenon due to a short-circuit of the cathode electrode and Ag included in the auxiliary electrode according to a comparison example. FIG. 5 shows an SEM image showing an example in which the burnt occurs due to the short-circuit of the cathode electrode and Ag included in the auxiliary electrode. A planar image is shown in (a) of FIG. 5, and a tomography image taken along a V-V' cut line is shown in (b) of FIG. 5.

An auxiliary electrode 468 includes a first auxiliary electrode 468a, a second auxiliary electrode 468b disposed on the first auxiliary electrode 468a, and a third auxiliary electrode 468c disposed on the second auxiliary electrode 468b. The first auxiliary electrode 468a and the third auxiliary electrode 468c may be formed of ITO or IZO, and the second auxiliary electrode 468b may be formed of Ag or an alloy including Ag.

Describing the connection configuration of the auxiliary electrode 468 and a cathode electrode 436 of the light emitting device, the auxiliary electrode 468 connected to a second low potential line 464 is electrically connected to the cathode electrode 436 with the electron transport layer 435 placed therebetween. This is different from the structure in the embodiment 1 of FIG. 3 in which the electron transport layer 135 is formed to expose a part of the top surface of the auxiliary electrode 168 (specifically, the first auxiliary electrode 168a) and the first auxiliary electrode 168a and the cathode electrode 136 are directly connected.

In the comparison example, since the electron transport layer 435 has a high resistance, a resistance between the auxiliary electrode 468 and the cathode electrode 136 can be increased. Accordingly, a high potential can be formed between the auxiliary electrode 468 and the cathode electrode 136. In this case, Ag elution (SH) may appear in the second auxiliary electrode 468b made of Ag or an alloy including Ag. A short circuit may occur between Ag and the cathode electrode 436 due to the Ag elution. A point where the short circuit occurs between Ag and the cathode electrode 436 has a lower resistance than that of the surrounding area, so that a current bias appears. The current bias causes burnt to occur.

On the other hand, since the embodiment 1 of FIG. 3 has a structure in which the first auxiliary electrode 168a and the cathode electrode 136 can be directly connected, it is possible to prevent burnt due to the short-circuit between the cathode electrode 136 and Ag included in the auxiliary electrode 168.

Figure 6:
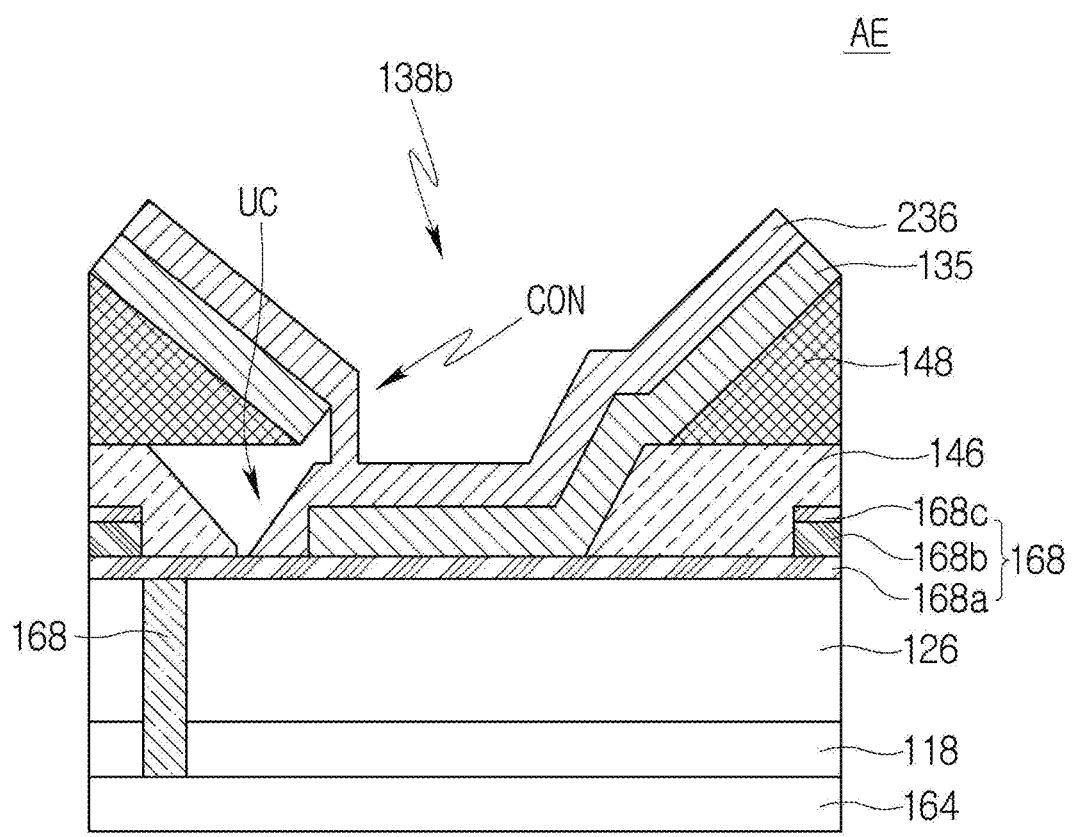
FIG. 6 is a view which shows an embodiment 2 and corresponds to the AE region of FIG. 2.

FIG. 6 is a view which shows an embodiment 2 and corresponds to the AE region of FIG. 2. In the AE region, the cathode electrode 136 and the auxiliary electrode 168 are connected in the second bank hole 138b.

In the second embodiment of FIG. 6, unlike the embodiment 1 of FIG. 3, a cathode electrode 137, that is the second electrode, is not separated by the undercut UC structure of the bank and is connected by a connecting portion CON formed in the vertical direction. The connecting portion CON may be formed by increasing the thickness of the cathode electrode 136 or by adjusting the height of the second bank 148 to be low.

In the embodiment 2, the thickness of the cathode electrode 136 is larger than that in the embodiment 1. Also, since the cathode electrode 136 is connected through the connecting portion CON, the area of the cathode electrode 136 in the connection region with the auxiliary electrode 168 is larger than that of the embodiment 1. Therefore, the embodiment 2 has an effect of further reducing the resistance of the cathode electrode 136 in the connection region of the second bank hole 138b than that of the embodiment 1.

FIGS. 7 to 13 are process cross sectional views showing schematically forming procedures of the auxiliary electrode and the cathode electrode in the second bank hole of the display device according to the embodiment.

Figure 7:
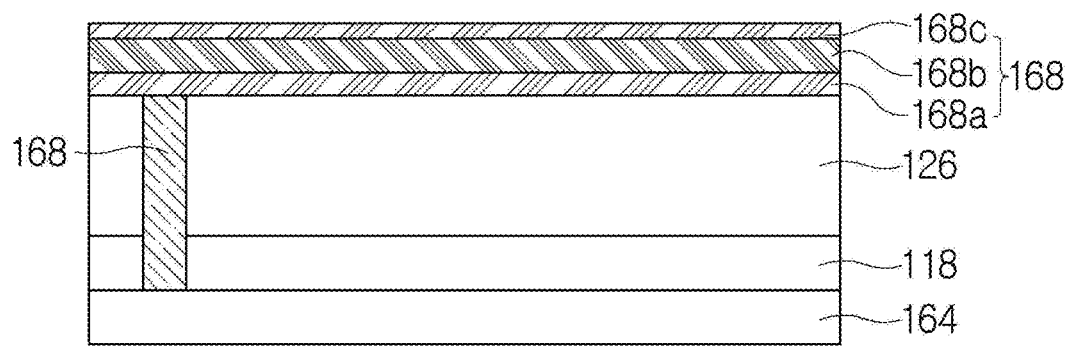
FIGS. 7 to 13 are process cross sectional views showing schematically forming procedures of the auxiliary electrode and the cathode electrode in a second bank hole of a display device according to the embodiment.

Referring to FIG. 7, the auxiliary electrode 168 is formed on the substrate on which the planarization layer 126 has been formed. Specifically, a conductive layer is deposited entirely on the substrate on which the planarization layer 126 has been formed. Here, the conductive layer has a multilayer structure which includes a transparent conductive layer and an opaque conductive layer having a high reflection efficiency.

The auxiliary electrode includes the first auxiliary electrode 168a, the second auxiliary electrode 168b disposed on the first auxiliary electrode 168a, and the third auxiliary electrode 168c disposed on the second auxiliary electrode 168b. The first auxiliary electrode 168a and the third auxiliary electrode 168c may be formed of ITO or IZO, and the second auxiliary electrode 168b may be formed of Ag or an alloy including Ag. It is preferable that the thickness of the first auxiliary electrode 168a is thicker than that of the third auxiliary electrode 168c. It is preferable that the first auxiliary electrode 168a should be formed thicker than the third auxiliary electrode 168c.

Figure 8:
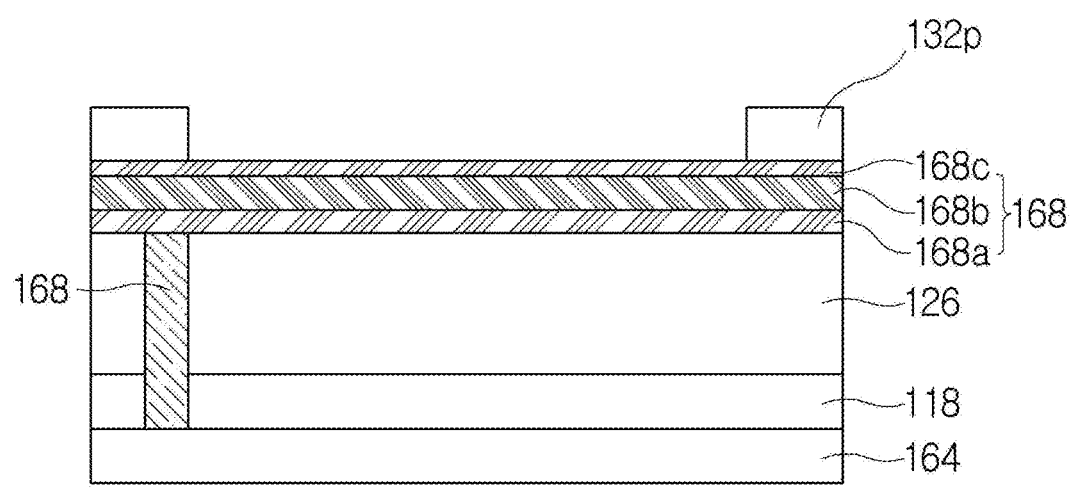
Figure 9:
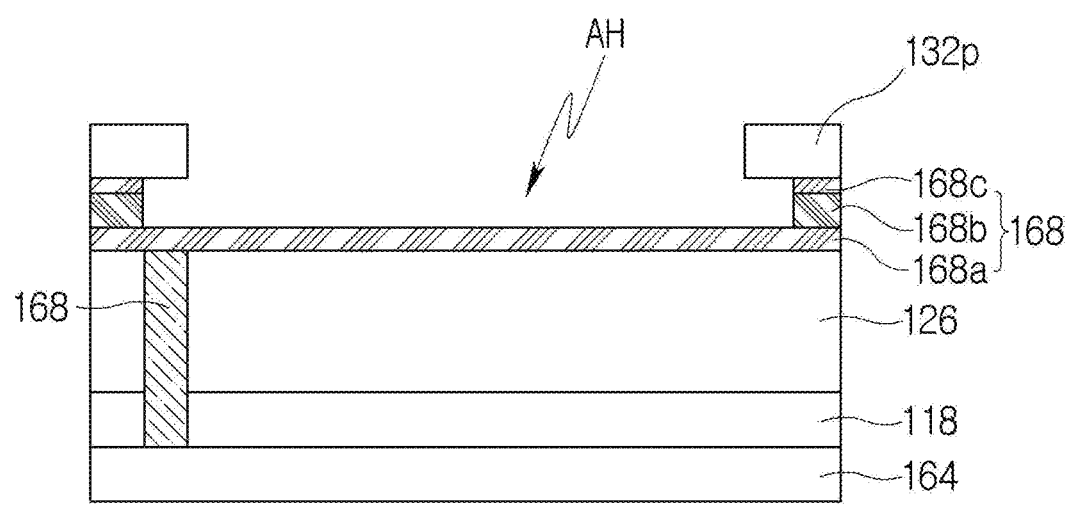
Figure 10:
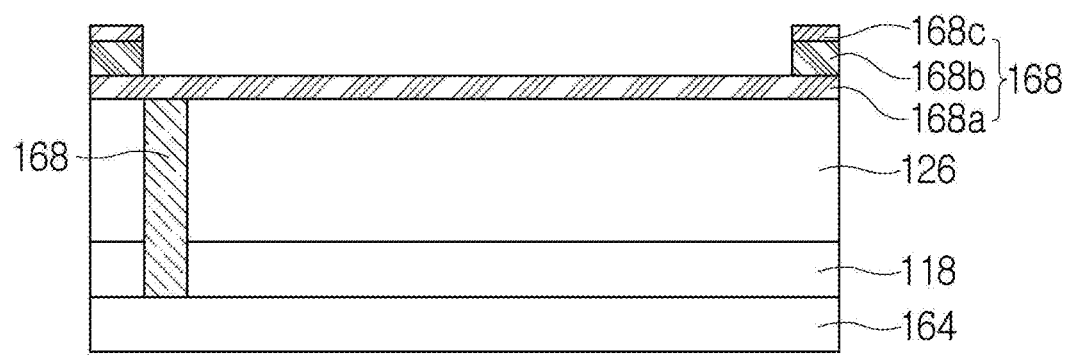

FIGS. 8 to 10 show steps of generating the auxiliary electrode hole AH, FIG. 8 shows a photo processing step of the auxiliary electrode 168, FIG. 9 shows an etching step of the auxiliary electrode 168, and FIG. 10 shows a step of stripping a photoresist.

In step of FIG. 8, a photoresist 132p material is applied on the third auxiliary electrode 168c, and a photoresist 132p pattern is formed through a mask. The photoresist 132p pattern is for creating the auxiliary electrode hole AH which partially exposes the top surface of the first auxiliary electrode 168a.

In step of FIG. 9, the auxiliary electrode hole AH is formed by patterning the second auxiliary electrode and the third auxiliary electrode. In step of patterning the auxiliary electrode hole AH, the second auxiliary electrode 168b and the third auxiliary electrode 168c are collectively etched through the photoresist pattern. Here, the first auxiliary electrode 168a may also be partially etched. However, as described in FIG. 7, since the thickness of the first auxiliary electrode 168a is larger than that of the third auxiliary electrode 168c, it does not mean that the first auxiliary electrode 168a is entirely etched to expose the planarization layer 126.

Regarding the etching, it is preferable to use wet etching which has a high etching rate and has isotropic properties having the same etching rate in the horizontal and vertical directions. When the second auxiliary electrode 168b and the third auxiliary electrode 168c are patterned by using the wet etching, the lower portion of the photoresist 132p can be etched as shown in FIG. 9.

A step of FIG. 10 is to remove the photoresist 132p pattern by proceeding stripping.

Figure 11:
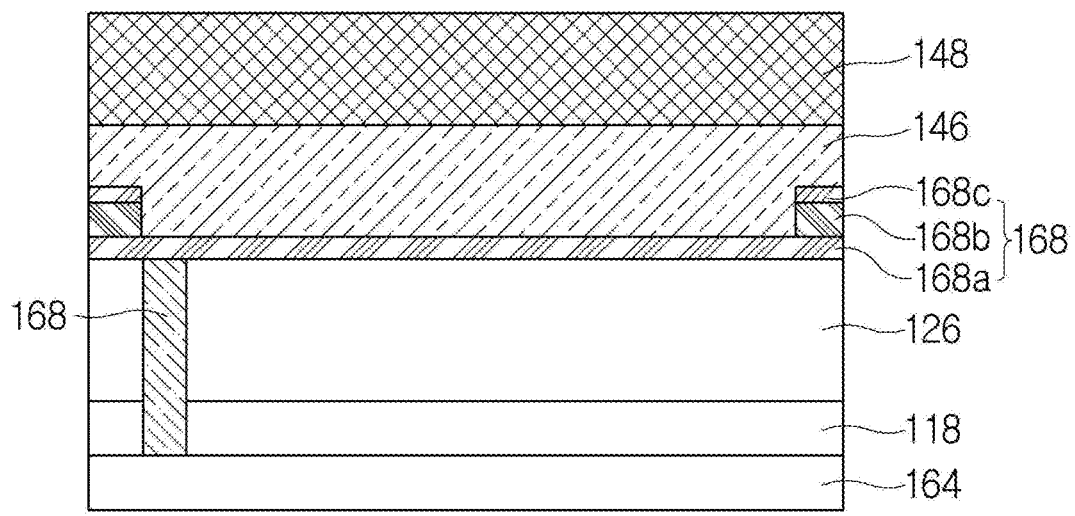
Figure 12:
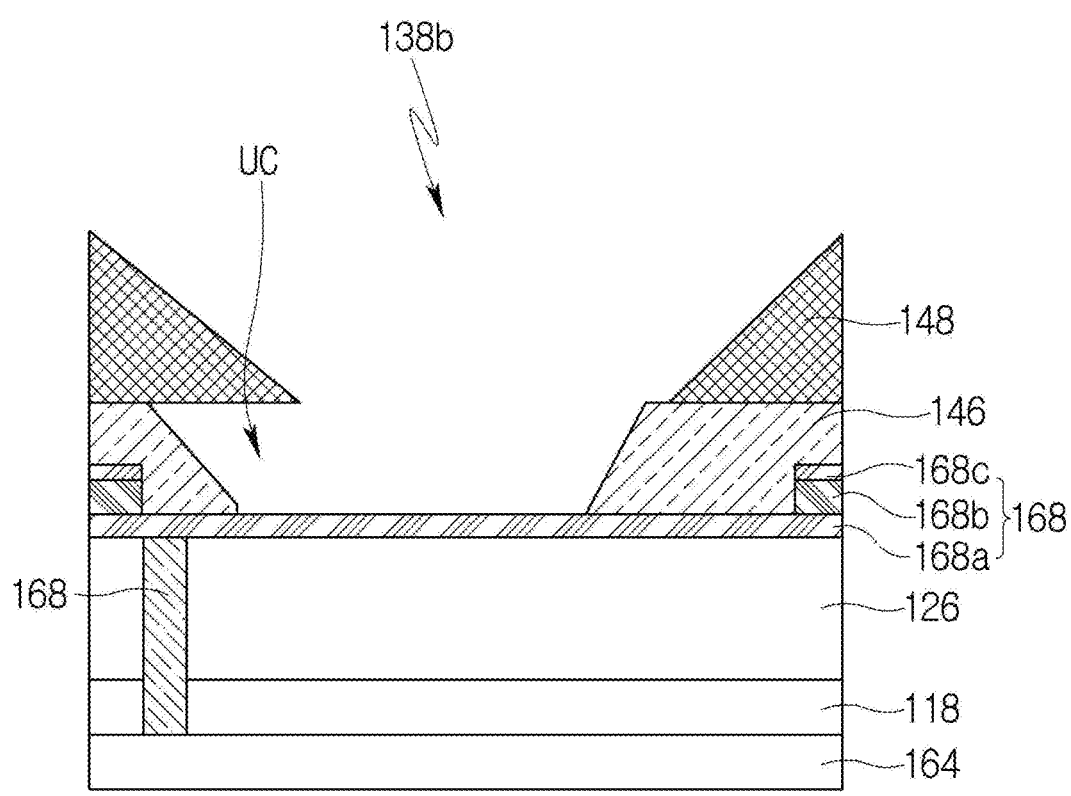

FIGS. 11 to 12 show steps of forming the bank. FIG. 11 shows a step of depositing the first bank 146 and the second bank 148. FIG. 12 shows a step of patterning the first bank 146 and the second bank 148.

In step of FIG. 11, the first bank 146 is formed of an inorganic insulating material such as SiNx or SiOx. The first bank 146 covers the auxiliary electrode hole which partially exposes the top surface of the first auxiliary electrode 168a, the side surface of the second auxiliary electrode 168b, and the third auxiliary electrode 168c. It is preferable to form the first bank 146 made of SiNx material by using silane gas $SiH_4$ and nitrogen gas $N_2$ as reactive gases in order to prevent changes in characteristics of the thin film transistor. The second bank 148 is formed of a photosensitive organic insulating material on the first bank 146.

In step of FIG. 12, the first bank 146 and the second bank 148 are patterned to form the second bank hole 138b which exposes the top surface of the auxiliary electrode 168. Also, the second bank hole 138b may form the undercut UC structure at one side through an undercut process. In other words, one side of the second bank 148, which is exposed by the second bank hole 138b protrudes more than one side of the first bank 146, which is exposed by the second bank hole 138b, so that the first bank 146 includes the undercut UC in a region corresponding to the second bank hole 138b. The structure of the undercut UC formed in the second bank hole 138b is to directly contact the cathode electrode with the first auxiliary electrode 168a.

Figure 13:
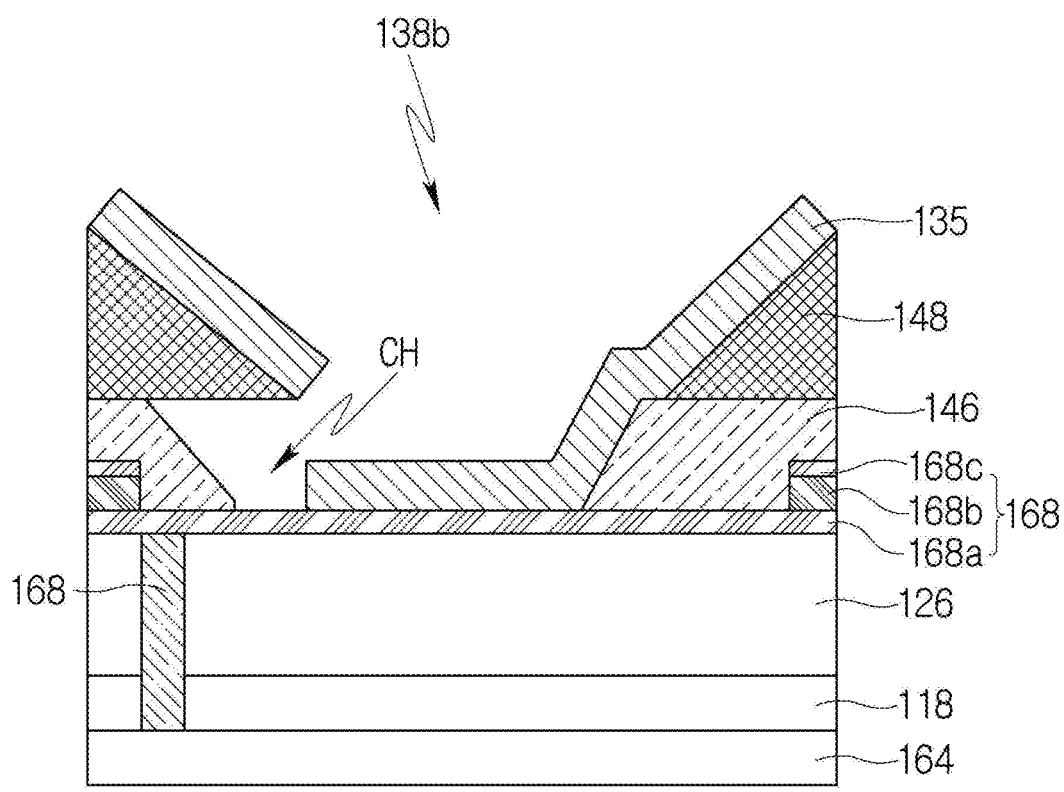

FIG. 13 shows a step of forming the electron transport layer 135 on the bank.

The electron transport layer 135 is formed through the deposition process. Here, the electron transport layer 135 is formed with vertical straightness. Accordingly, the electron transport layer 135 is not formed in the undercut UC region. In other words, the electron transport layer 135 is deposited without being deposited in the undercut UC structure. As a result of the formation of the electron transport layer 135 without being deposited in the undercut UC structure, a portion of the first auxiliary electrode 168a is exposed, so that a cathode contact hole CH is obtained. The cathode contact hole CH is for directly contacting the cathode electrode with the first auxiliary electrode 168a.

In a subsequent step, the cathode electrode 136 is formed on the electron transport layer 135 (see FIGS. 3 and 6). The cathode electrode 136 is formed through the deposition process, and the cathode electrode 136 is formed with diffraction properties in vertical, horizontal and oblique directions. The cathode electrode 136 which is formed with diffraction properties in vertical, horizontal and oblique directions is formed in the undercut UC region. As a result, the cathode electrode 136 and the first auxiliary electrode 168a are directly connected.

As described above, in the display device according to the embodiment (for example, FIGS. 3 and 6), the first bank 146 positioned under the second bank 148 having a reverse tapered shape includes the undercut UC. Due to the undercut UC, the first auxiliary electrode 168a is exposed within the second bank hole 138b without a separate structure, and the first auxiliary electrode 168a and the cathode electrode 136 are electrically connected. As a result, the display device according to the embodiment is able to prevent burnt due to a short-circuit between the cathode electrode 136 and Ag included in the auxiliary electrode 168.

In various embodiments, the cathode electrode 136 that is the second electrode may or may not be separated by the undercut UC structure of the bank. As described with reference to FIG. 6, by increasing the thickness of the cathode electrode 136 or by adjusting the height of the second bank 148 to be low, the cathode electrode 136 can be formed such that the cathode electrode 136 is not separated by the undercut UC structure of the bank and is connected by the connecting portion formed in the vertical direction. As a result, there is an effect of additionally reducing the resistance of the cathode electrode 136 in the connection region of the second bank hole 138b.

As described above, the organic light emitting display according to the embodiment uses the auxiliary electrode to prevent a voltage drop of the cathode, thereby improving an image quality. Also, the organic light emitting display according to the embodiment may facilitate contact between the auxiliary electrode and the cathode electrode. Also, in the organic light emitting display according to the embodiment, since the cathode electrode and the auxiliary electrode can be directly connected, it is possible to prevent burnt due to a short-circuit between the cathode electrode and Ag included in the auxiliary electrode.

While the embodiment of the present invention has been described with reference to the accompanying drawings, it can be understood by those skilled in the art that the present invention can be embodied in other specific forms without departing from its spirit or essential characteristics. Therefore, the foregoing embodiments and advantages are merely exemplary and are not to be construed as limiting the present invention. The present teaching can be readily applied to other types of apparatuses. The description of the foregoing embodiments is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display device, comprising:
    a light emitting device which comprises a first electrode, a light emitting layer disposed on the first electrode, an electron transport layer disposed on the light emitting layer, and a second electrode disposed on the electron transport layer;
    a driving transistor which is electrically connected to the first electrode and supplies a driving current to the light emitting device;
    an auxiliary electrode which is disposed apart from the driving transistor and is electrically connected to the second electrode; and
    a bank which is composed of multiple layers on the auxiliary electrode and of which a lowest layer adjacent to the auxiliary electrode among the multiple layers comprises an undercut,
    wherein the auxiliary electrode comprises a first auxiliary electrode, a second auxiliary electrode disposed on the first auxiliary electrode, a third auxiliary electrode disposed on the second auxiliary electrode, and an auxiliary electrode hole which exposes a top surface of the first auxiliary electrode, and
    wherein the second electrode is electrically connected to the top surface of the first auxiliary electrode in the auxiliary electrode hole.

2. The display device of claim 1, wherein the first auxiliary electrode and the third auxiliary electrode are formed of ITO or IZO, and wherein the second auxiliary electrode is formed of Ag or an alloy including Ag.

3. The display device of claim 1, comprising a second bank hole which exposes at least one side of the bank in a reverse tapered shape and exposes the top surface of the first auxiliary electrode.

4. The display device of claim 3, wherein the bank comprises:
    a first bank comprising an undercut; and
    a second bank stacked on the first bank.

5. The display device of claim 4, wherein the first bank is formed of an inorganic insulating material, and wherein the second bank is formed of an organic insulating material.

6. The display device of claim 3, wherein one side of the second bank, which is exposed by the second bank hole protrudes more than one side of the first bank, which is exposed by the second bank hole.

7. The display device of claim 3, wherein the electron transport layer is disposed on the first auxiliary electrode within the second bank hole, and wherein the display device comprises a contact hole which exposes a part of the top surface of the first auxiliary electrode.

8. The display device of claim 7, wherein the second electrode is electrically connected to the top surface of the first auxiliary electrode in the contact hole.

9. The display device of claim 1, wherein the electron transport layer is located on the bank and is separated by the undercut structure.

10. The display device of claim 1, wherein the second electrode is located on the bank and is separated by the undercut structure.

11. The display device of claim 1, wherein a thickness of the bank is larger than that of the light emitting layer.

12. The display device of claim 1, wherein the first electrode and the auxiliary electrode are formed of the same material and have the same structure.

13. The display device of claim 1, wherein a thickness of the first auxiliary electrode is larger than that of the third auxiliary electrode.

* * * * *